United States Patent
Lai et al.

(10) Patent No.: US 11,088,030 B2
(45) Date of Patent: Aug. 10, 2021

(54) SEMICONDUCTOR DEVICE AND A METHOD FOR FABRICATING THE SAME

(71) Applicant: TAIWAN SEMICONDUCTOR MANUFACTURING CO., LTD., Hsinchu (TW)

(72) Inventors: Jui-Yao Lai, Changhwa (TW); Ru-Gun Liu, Zhubei (TW); Sai-Hooi Yeong, Zhubei (TW); Yen-Ming Chen, Chu-Pei (TW); Yung-Sung Yen, New Taipei (TW); Ying-Yan Chen, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 687 days.

(21) Appl. No.: 15/157,200

(22) Filed: May 17, 2016

(65) Prior Publication Data
US 2017/0194211 A1 Jul. 6, 2017

Related U.S. Application Data

(60) Provisional application No. 62/273,378, filed on Dec. 30, 2015.

(51) Int. Cl.
*H01L 21/8234* (2006.01)
*H01L 21/768* (2006.01)
(Continued)

(52) U.S. Cl.
CPC ........ *H01L 21/823468* (2013.01); *H01L 21/76834* (2013.01); *H01L 21/76897* (2013.01);
(Continued)

(58) Field of Classification Search
None
See application file for complete search history.

(56) References Cited

U.S. PATENT DOCUMENTS

| 7,667,271 B2 | 2/2010 | Yu et al. |
| 7,910,453 B2 | 3/2011 | Xu et al. |

(Continued)

FOREIGN PATENT DOCUMENTS

| CN | 104584222 A | 4/2015 |
| CN | 104600023 A | 5/2015 |

(Continued)

OTHER PUBLICATIONS

Office Aciton issued in corresponding German Application No. 10 2016 118 207.9, dated Sep. 24, 2019.

*Primary Examiner* — Shaun M Campbell
*Assistant Examiner* — Aneta B Cieslewicz
(74) *Attorney, Agent, or Firm* — McDermott Will & Emery LLP

(57) ABSTRACT

A semiconductor device includes a first gate structure, a second gate structure, a first source/drain structure and a second source/drain structure. The first gate structure includes a first gate electrode and a first cap insulating layer disposed on the first gate electrode. The second gate structure includes a second gate electrode and a first conductive contact layer disposed on the first gate electrode. The first source/drain structure includes a first source/drain conductive layer and a second cap insulating layer disposed over the first source/drain conductive layer. The second source/drain structure includes a second source/drain conductive layer and a second conductive contact layer disposed over the second source/drain conductive layer.

18 Claims, 14 Drawing Sheets

(51) Int. Cl.
  *H01L 29/66*   (2006.01)
  *H01L 29/06*   (2006.01)
  *H01L 29/423*  (2006.01)
  *H01L 29/78*   (2006.01)
  *H01L 29/417*  (2006.01)
  *H01L 23/535*  (2006.01)

(52) U.S. Cl.
  CPC ........ *H01L 21/823418* (2013.01); *H01L 21/823431* (2013.01); *H01L 21/823456* (2013.01); *H01L 21/823475* (2013.01); *H01L 23/535* (2013.01); *H01L 29/0649* (2013.01); *H01L 29/41791* (2013.01); *H01L 29/42356* (2013.01); *H01L 29/6656* (2013.01); *H01L 29/66795* (2013.01); *H01L 29/785* (2013.01); *H01L 29/66545* (2013.01)

(56) References Cited

U.S. PATENT DOCUMENTS

| | | | |
|---|---|---|---|
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,153,483 B2 | 10/2015 | Shieh et al. | |
| 9,202,751 B2 | 12/2015 | Wei et al. | |
| 2002/0055222 A1* | 5/2002 | Kim | H01L 21/76897 438/239 |
| 2006/0006476 A1 | 1/2006 | Biery et al. | |
| 2013/0175583 A1 | 7/2013 | Yuan et al. | |
| 2014/0001574 A1 | 1/2014 | Chen et al. | |
| 2014/0077305 A1* | 3/2014 | Pethe | H01L 21/76895 257/368 |
| 2014/0110755 A1 | 4/2014 | Colinge | |
| 2014/0151812 A1 | 6/2014 | Liaw | |
| 2015/0021710 A1 | 1/2015 | Hsu et al. | |
| 2015/0091093 A1 | 4/2015 | Bouche et al. | |
| 2015/0118837 A1* | 4/2015 | Shieh | H01L 21/76879 438/586 |
| 2015/0279738 A1 | 10/2015 | Wells et al. | |
| 2015/0287636 A1* | 10/2015 | Wei | H01L 21/823878 257/368 |
| 2016/0133623 A1* | 5/2016 | Xie | H01L 27/088 257/384 |
| 2016/0336399 A1* | 11/2016 | Labonte | H01L 29/78 |

FOREIGN PATENT DOCUMENTS

| | | |
|---|---|---|
| CN | 104979279 A | 10/2015 |
| KR | 10-2007-0029799 A | 3/2007 |
| KR | 10-2015-0010547 A | 1/2015 |
| TW | 201539654 A | 10/2015 |
| WO | 2013095548 A1 | 6/2013 |
| WO | 2014046856 A1 | 3/2014 |

* cited by examiner

US 11,088,030 B2

SEMICONDUCTOR DEVICE AND A METHOD FOR FABRICATING THE SAME

RELATED APPLICATIONS

This application claims a priority of U.S. Provisional Application No. 62/273,378 filed on Dec. 30, 2015, the entire contents of which are incorporated herein by reference.

TECHNICAL FIELD

The disclosure relates to a method for manufacturing a semiconductor device, and more particularly to a structure and a manufacturing method for a self-align contact or a sacrificial layer structure over source/drain regions.

BACKGROUND

With a decrease of dimensions of semiconductor devices, a sacrificial layer structure (SAC) has been widely utilized for fabricating, e.g., source/drain (S/D) contacts arranged closer to gate structures in a field effect transistor (FET). Typically, a SAC is fabricated by patterning an interlayer dielectric (ILD) layer on the top of gate structure and between sidewall spacers. The SAC layer is formed by a dielectric filling and planarization after metal gate etches back. The SAC layer on the top of gate, typically as nitride, creates a good etching selectivity compared to the dielectric of ILD, which is typically oxide, on the top of S/D. This selective etching process improves the S/D contact process window. As the device density increases (i.e., the dimensions of semiconductor device decreases), the thickness of the sidewall spacer becomes thinner, which may cause a short circuit between the S/D contact and the gate electrodes. Accordingly, it has been required to provide SAC structures to gain the process window of the formation electrical isolation between the S/D contacts and gate electrodes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comp rising" or "consisting of."

Figure 1A:
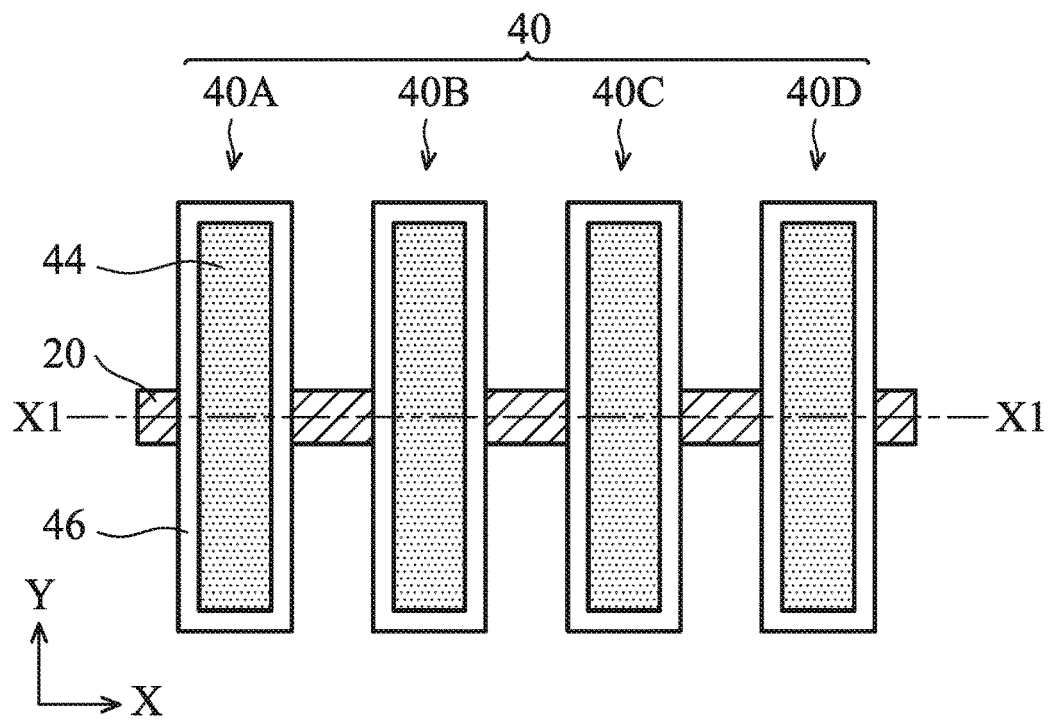
FIG. 1A shows an exemplary plan view (viewed from the above) illustrating one stage of a sequential fabrication process of a semiconductor device according to one embodiment of the present disclosure.
Figure 1B:
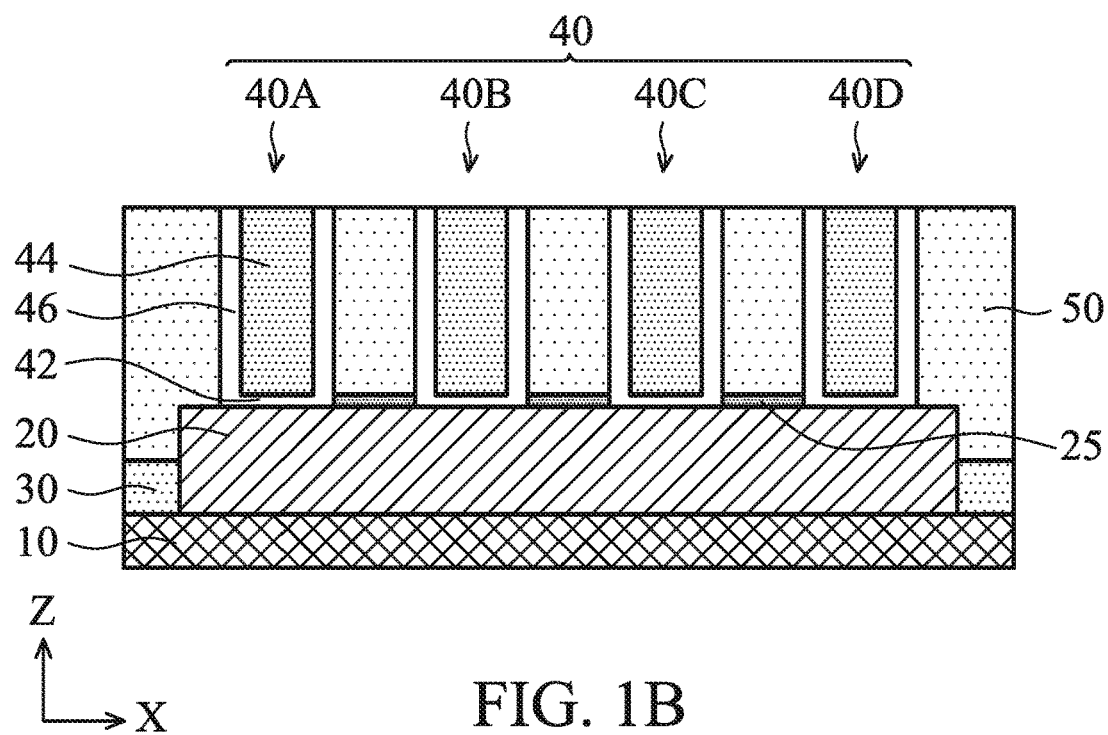
FIG. 1B shows an exemplary cross sectional view along line X1-X1 of FIG. 1A.

FIGS. 1A and 1B show one stage of a sequential fabrication process of a semiconductor device according to one embodiment of the present disclosure. FIG. 1A shows a plan (top) view and FIG. 1B shows a cross sectional view along line X1-X1 of FIG. 1A.

FIGS. 1A and 1B show a structure of a semiconductor device after metal gate structures are formed. In FIGS. 1A and 1B, metal gate structures 40 are formed over a channel layer, for example, a part of a fin structure 20 formed over a substrate 10. The metal gate structures 40 includes a first to a fourth metal gate structures 40A, 40B, 40C and 40D, and extend in the Y direction and are arranged in the X direction. The thickness of the metal gate structures 40 is in a range from about 20 nm to about 80 nm in some embodiments. Each of the gate structures 40 includes a gate dielectric layer 42, a metal gate electrode 44 and sidewall spacers 46 provided on major sidewalls of metal gate electrode 44. The sidewall spacers 46 are made of at least one of SiN, SiON, SiCN, or SiOCN. The film thickness of the sidewall spacers 46 at the bottom of the sidewall spacers is in a range from about 3 nm to about 15 nm in some embodiments, and is in a range from about 4 nm to about 8 nm in other embodiments. Further, source/drain regions 25 are formed adjacent to the gate structures, and spaces between the gate structures are filled with a first interlayer dielectric (ILD) layer 50. The first ILD layer 50 includes one or more layers of insulating material, such as $SiO_2$, SiON, SiOCN, or SiCN. In one embodiment, $SiO_2$ is used. In this disclosure, a source and a drain are interchangeably used and "source/drain" refers to one of a source and a drain.

Figure 1C:
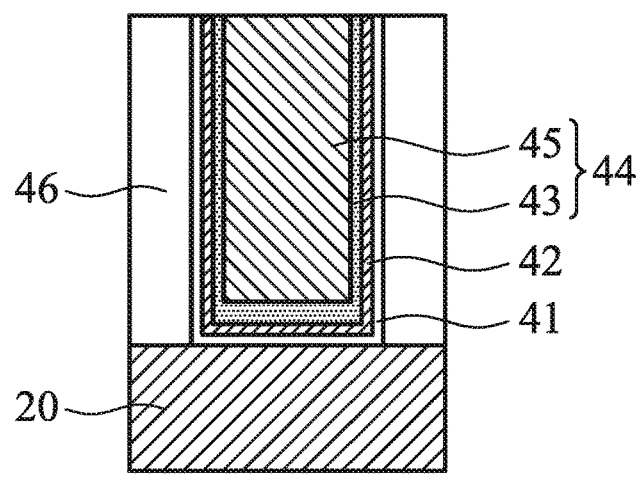
FIG. 1C is an enlarged view of the gate structure shown in FIG. 1B.

FIG. 1C is an enlarged view of the gate structure. The metal gate structure 40 includes one or more layers 45 of metal material, such as Al, Cu, W, Ti, Ta, TiN, TiAl, TiAlC, TiAlN, TaN, NiSi, CoSi, and other conductive materials. A gate dielectric layer 42 disposed between the channel layer and the metal gate electrode 44 includes one or more layers of metal oxides such as a high-k metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, an interface dielectric layer 41 made of, for example silicon dioxide, is formed between the channel layer and the gate dielectric layer 42.

In some embodiments, one or more work function adjustment layers 43 are interposed between the gate dielectric layer 42 and the metal material 45. The work function adjustment layers 43 are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, TiSi and TaSi is used as the work function adjustment layer, and for the p-channel FET, one or more of TiAlC, TiAl, TaN, TaAlC, TiN, TiC and Co is used as the work function adjustment layer.

In this embodiment, fin field effect transistors (Fin FETs) fabricated by a gate-replacement process are employed.

Figure 1D:
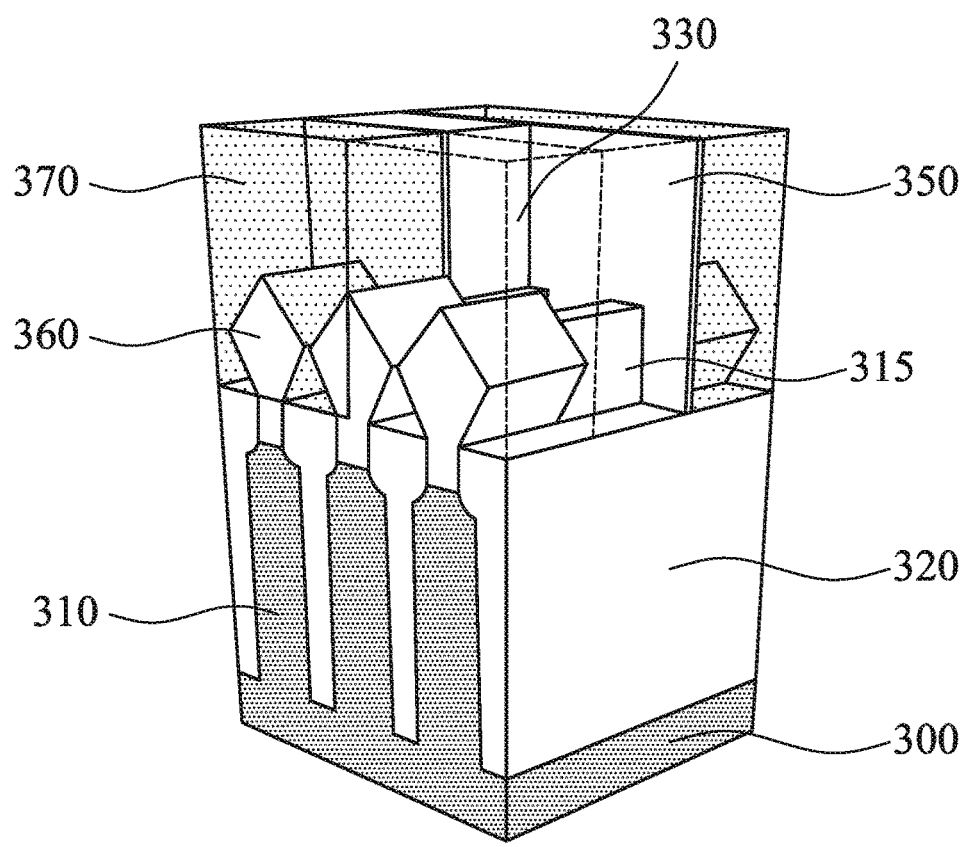
FIG. 1D shows an exemplary perspective view illustrating one stage of a sequential fabrication process of a semiconductor device according to one embodiment of the present disclosure.

FIG. 1D shows an exemplary perspective view of a Fin FET structure.

First, a fin structure 310 is fabricated over a substrate 300. The fin structure includes a bottom region and an upper region as a channel region 315. The substrate is, for example, a p-type silicon substrate with an impurity concentration in a range from about $1 \times 10^{15}$ cm$^{-3}$ to about $1 \times 10^{18}$ cm$^{-3}$. In other embodiments, the substrate is an n-type silicon substrate with an impurity concentration in a range from about $1 \times 10^{15}$ cm$^{-3}$ to about $1 \times 10^{18}$ cm$^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate.

After forming the fin structure 310, an isolation insulating layer 320 is formed over the fin structure 310. The isolation insulating layer 320 includes one or more layers of insulating materials such as silicon oxide, silicon oxynitride or silicon nitride, formed by LPCVD (low pressure chemical vapor deposition), plasma-CVD or flowable CVD. The isolation insulating layer may be formed by one or more layers of spin-on-glass (SOG), SiO, SiON, SiOCN and/or fluorine-doped silicate glass (FSG).

After forming the isolation insulating layer 320 over the fin structure, a planarization operation is performed so as to remove part of the isolation insulating layer 320. The planarization operation may include a chemical mechanical polishing (CMP) and/or an etch-back process. Then, the isolation insulating layer 320 is further removed (recessed) so that the upper region of the fin structure is exposed.

A dummy gate structure is formed over the exposed fin structure. The dummy gate structure includes a dummy gate electrode layer made of poly silicon and a dummy gate dielectric layer. Sidewall spacers 350 including one or more layers of insulating materials are also formed on sidewalls of the dummy gate electrode layer. After the dummy gate structure is formed, the fin structure 310 not covered by the dummy gate structure is recessed below the upper surface of the isolation insulating layer 320. Then, a source/drain region 360 is formed over the recessed fin structure by using an epitaxial growth method. The source/drain region may include a strain material to apply stress to the channel region 315.

Then, an interlayer dielectric layer (ILD) 370 is formed over the dummy gate structure and the source/drain region 360. After a planarization operation, the dummy gate structure is removed so as to make a gate space. Then, in the gate space, a metal gate structure 330 including a metal gate electrode and a gate dielectric layer, such as a high-k dielectric layer, is formed. In FIG. 1D, the view of parts of the metal gate structure 330, sidewalls 350 and the ILD 370 are cut to show the underlying structure.

The metal gate structure 330 and the sidewalls 350, source/drain 360 and the ILD 370 of FIG. 1D substantially correspond to the metal gate structure 40, source/drain regions 25 and first interlayer dielectric layer (ILD) 50, of FIGS. 1A and 1B, respectively.

FIGS. 2-13 show exemplary cross sectional views corresponding to line X1-X1 of FIG. 1A, illustrating various stages of the sequential fabrication process of a semiconductor device according to one embodiment of the present disclosure. It is understood that additional operations can be provided before, during, and after processes shown by FIGS. 2-13, and some of the operations described below can be replaced or eliminated, for additional embodiments of the method. The order of the operations/processes may be interchangeable.

Figure 2:
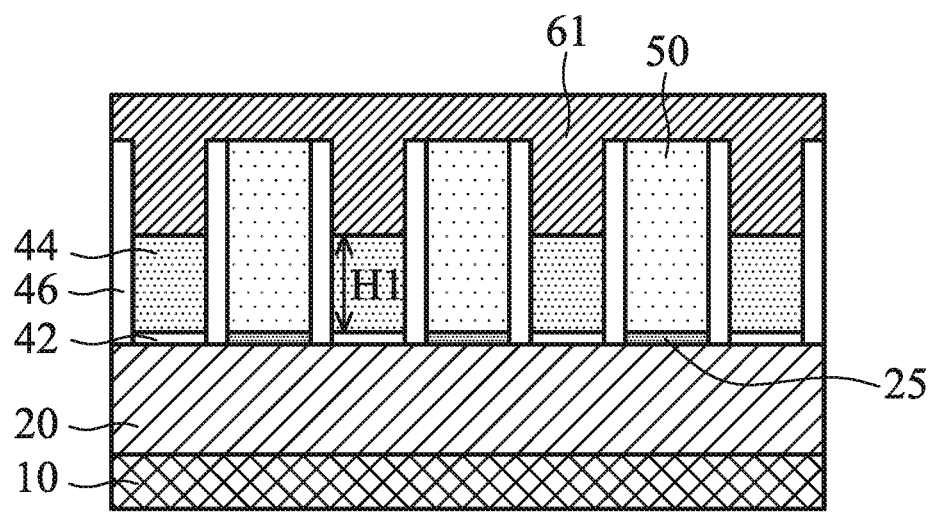
FIGS. 2-13 show exemplary cross sectional views illustrating various stages of the sequential fabrication process of a semiconductor device according to one embodiment of the present disclosure.

As shown in FIG. 2, the metal gate electrodes 44 are recessed below the upper surface of the sidewall spacers 46 by a dry and/or a wet etching operation. The remaining height H1 of the recessed gate electrode 44 is in a range from about 15 nm to about 50 nm in some embodiments.

After the gate electrodes 44 are recessed, a blanket layer 61 of a first insulating material is formed, as shown in FIG. 2. The first insulating material includes one or more of SiC, SiON, SiOCN, SiCN and SiN.

Figure 3:
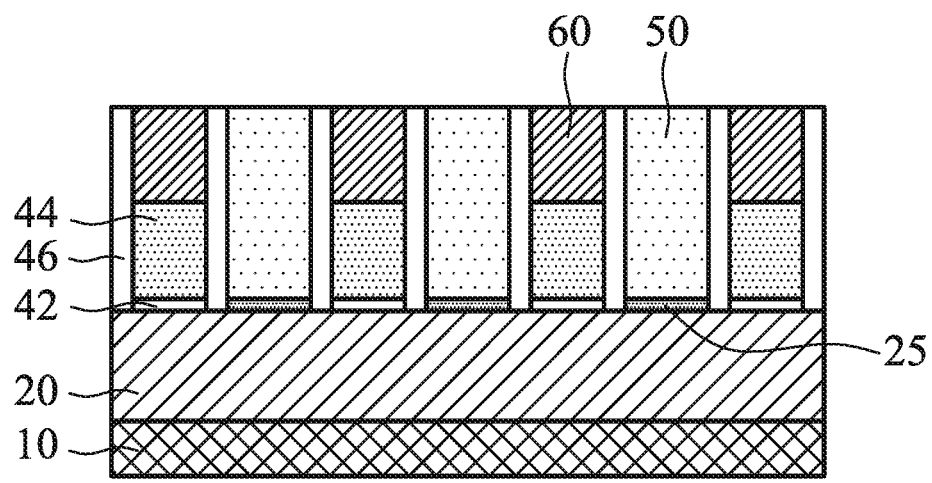

A planarization operation, such as an etch-back process or a chemical mechanical polishing (CMP) process, is performed on the blanket layer 61, so that the gate cap insulating layers 60 are formed over the gate electrode 44, as shown in FIG. 3.

Figure 4:
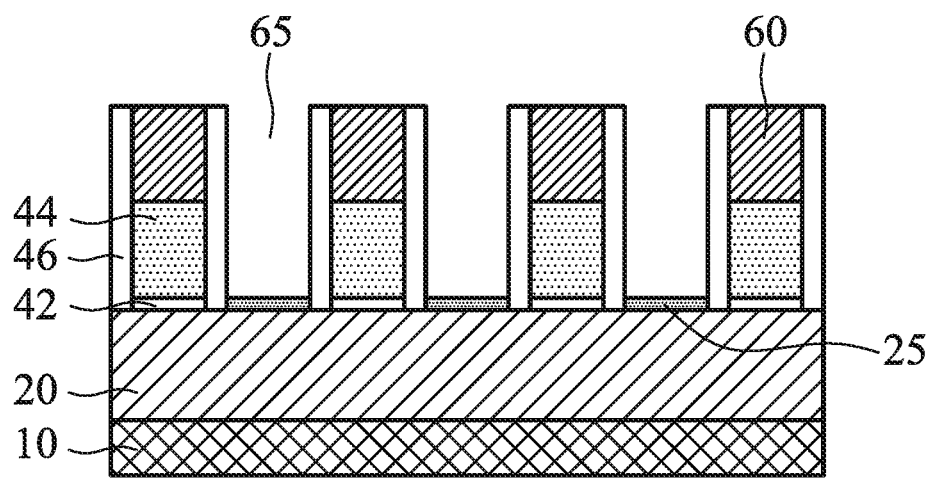

As shown in FIG. 4, the first ILD layer 50 is removed by a thy and/or a wet etching, thereby forming openings 65 and exposing the source/drain structures 25 at the bottoms of the openings 65.

Figure 5:
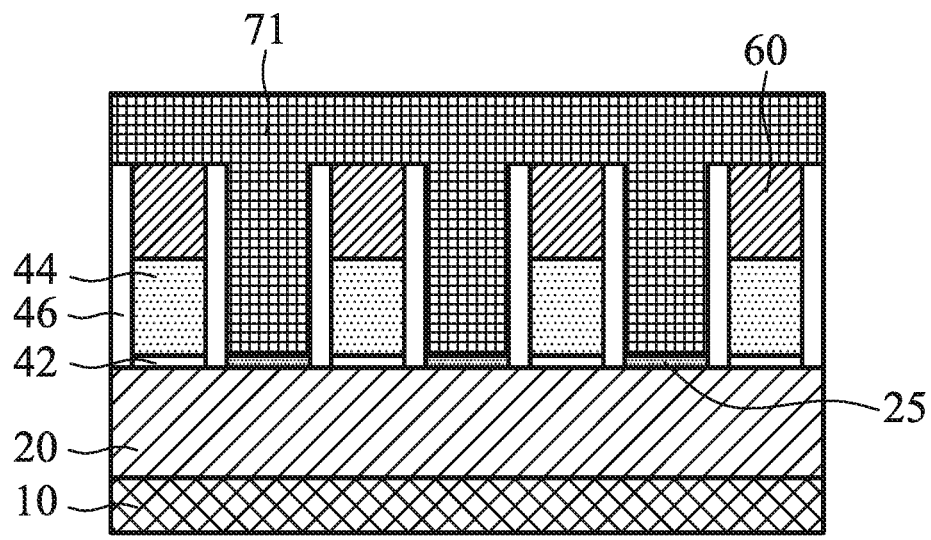

Subsequently, a blanket layer of a first conductive material 71 is formed, as shown in FIG. 5. The first conductive material 71 includes one or more of W, Co, Ni, or Ti. At the interface between the first conductive material 71 and the source/drain structure 25, a silicide layer, such as WSi, CoSi$_2$ or TiSi, may be formed. In one embodiment, W is used.

Figure 6:
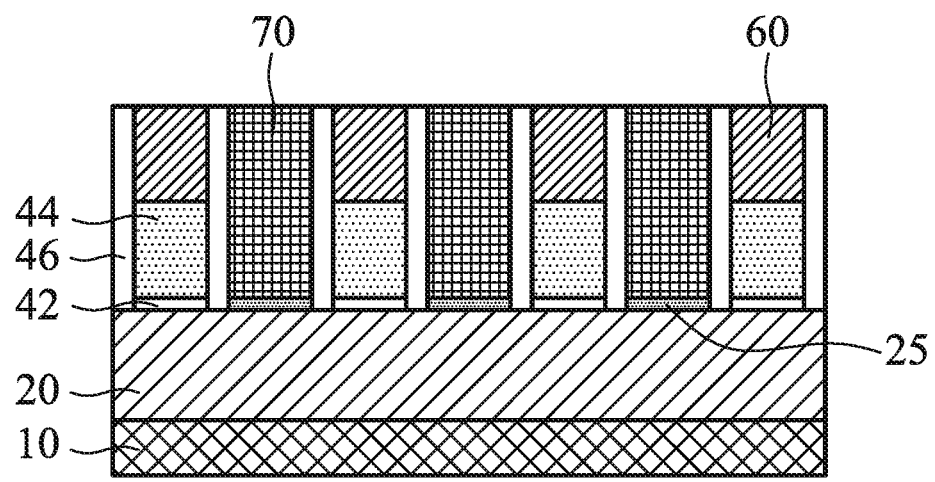

A planarization operation, such as an etch-back process or a CMP process, is performed on the blanket layer 71, so that the source/drain conductive layers 70 are formed over the source/drain regions 25, as shown in FIG. 6.

Figure 7:
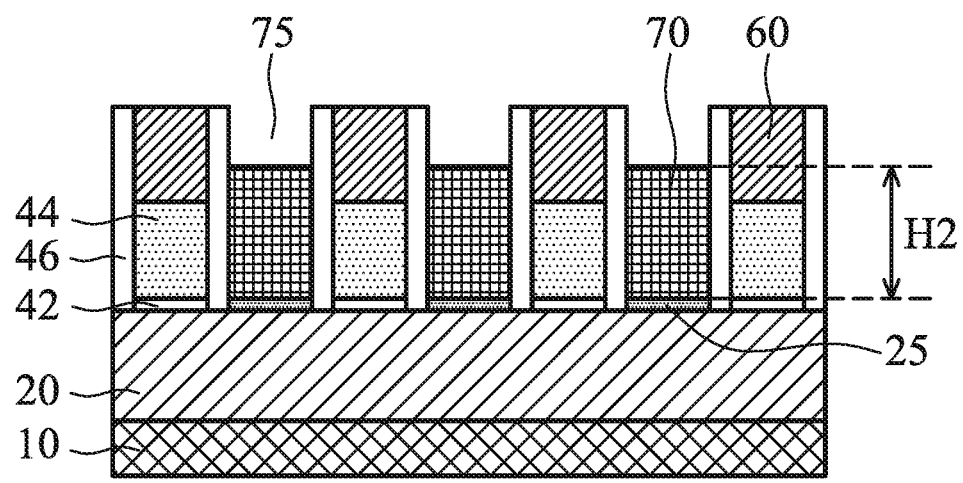

Then, as shown in FIG. 7, the source/drain conductive layers 70 are recessed below the upper surface of the sidewall spacers 46 by a dry and/or a wet etching operation. The remaining height H2 of the recessed source/drain conductive layer 70 is in a range from about 15 nm to about 50 nm in some embodiments.

Figure 8:
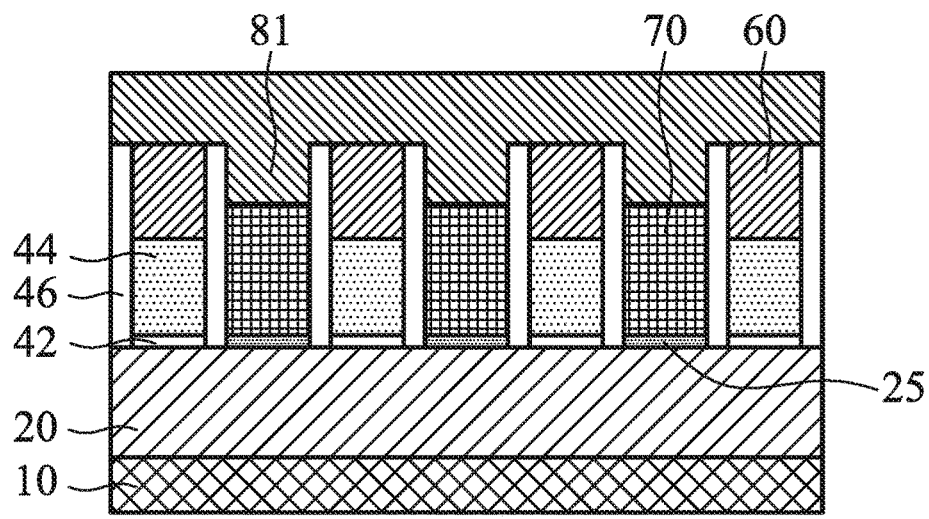

Subsequently, a blanket layer of a second insulating material 81 is formed, as shown in FIG. 8. The second insulating material 81 is different from the first insulating material 61 and includes one or more of SiC, SiON, Al$_2$O$_3$, SiOCN, SiCN and SiN. The two materials for the first and second insulating materials are interchangeable to fulfill different process requirements.

Figure 9:
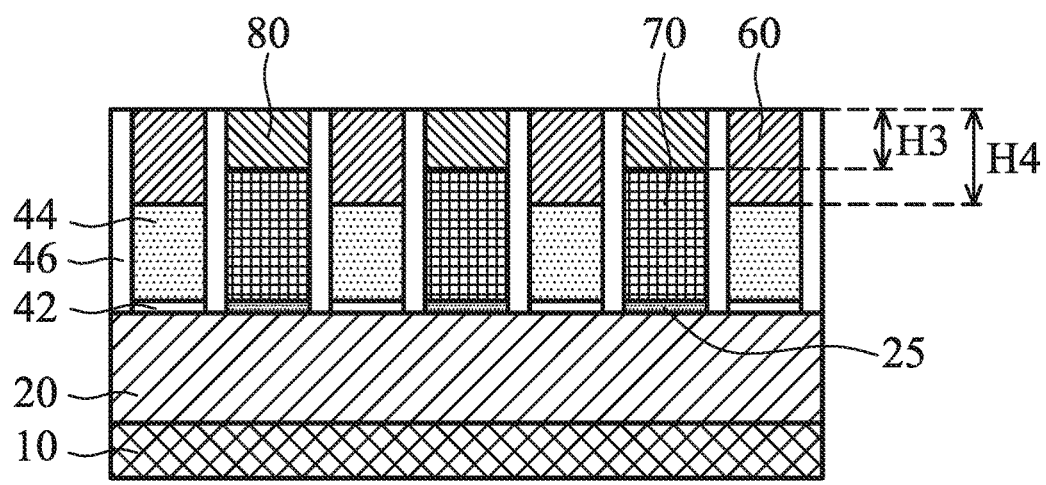

A planarization operation, such as an etch-back process or a CMP process, is performed on the blanket layer 81, so that the source/drain cap insulating layers 80 are formed over the source/drain conductive layers 70, as shown in FIG. 9. As shown in FIG. 9, plural gate structures extending in the Y direction are arranged in the X direction with an equal interval. Each of the gate structures includes a gate electrode 44, a gate cap insulating layer 60 disposed over the gate electrode 44, sidewall spacers 46 disposed on opposing side faces of the gate electrode 44 and the gate cap insulating layer 60. Further, plural source; drain structures are disposed between adjacent two gate structures. Each of the source/drain structure includes a source/drain conductive layer 70 and a source/drain cap insulating layer 80 disposed on the source/drain conductive layer 70.

The thickness H4 of the gate cap insulating layer 60 is in a range from about 10 nm to about 40 nm in some embodiments. The thickness H3 of the source/drain cap insulating layer 80 is in a range from about 10 nm to about 40 nm in some embodiments.

Figure 10:
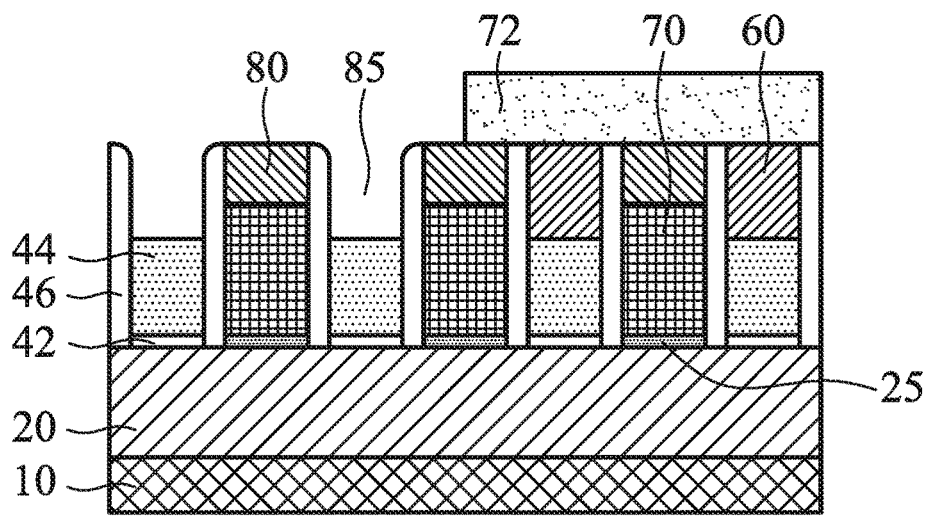

Next, as shown in FIG. 10, at least one gate structure (e.g., gate structures 40C and 40D) and at least one source/drain structure with the source/drain cap insulating layer are covered by a first mask layer 72, while at least one gate structure (e.g., 40A and 40B) and at least one source/drain structure with the source/drain cap insulating layer are exposed. Then, the gate cap insulating layers 60 are selectively removed, thereby forming a gate opening 85.

Here, the gate cap insulating layer 60, the source/drain cap insulating layer 80 and the sidewall spacers 45 are made of different insulating materials. In particular, the source/drain cap insulating layer 80 and the sidewall spacers 45 are materials having a high etching selectivity (about 4 or more) with respect to the gate cap insulating layer 60 in the etching of the gate cap insulating layer 60. In some embodiments, the etching selectivity is about 6 to 20. Accordingly, the gate cap insulating layers 60 can be selectively removed in a self-aligned manner. As shown in FIG. 10, an edge of the opening pattern of the first mask layer 72 may be located on at least one source/drain cap insulating layer 80.

In some embodiments, a second ILD layer 110 (see, FIG. 24) made of, for example, SiO$_2$ (or one or more of SiON, SiOCN, SiCN or SiCO), is formed over the structure of FIG. 9 before forming the first mask layer 72. In such a case, the second ILD is first etched by using the first mask layer 72 as an etching mask, and then the gate cap insulating layers 60 are etched. The etching condition for etching the second ILD may be different from the etching condition for etching the gate cap insulating layers.

Figure 11:
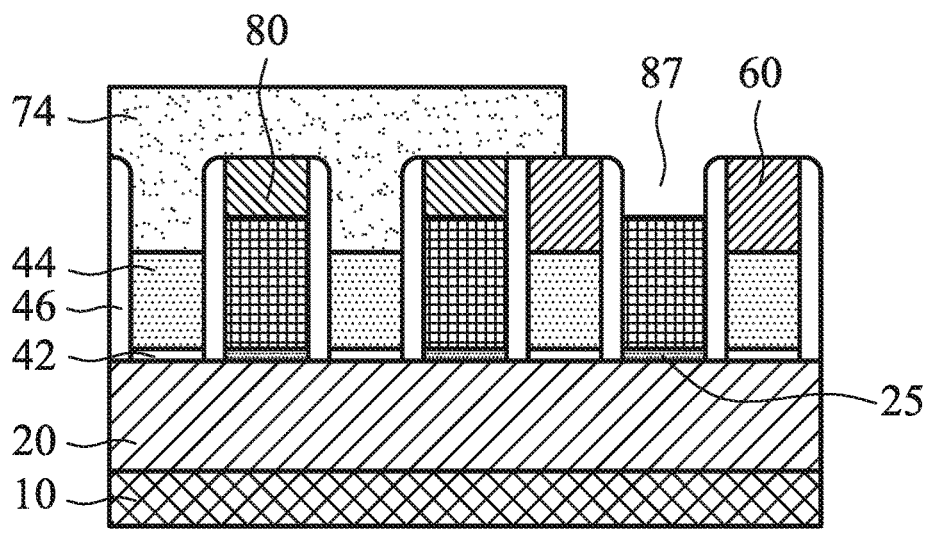

Similarly, as shown in FIG. 11, at least one gate structure (e.g., gate structures 40A and 40A) and at least one source/drain structure with the source/drain cap insulating layer are covered by a second mask layer 74, while at least one gate structure (e.g., 40D) and at least one source/drain structure with the source/drain cap insulating layer are exposed. Then, the source/drain cap insulating layer 80 are selectively removed, thereby forming a source/drain opening 87. Here, the gate cap insulating layer 60 and the sidewall spacers 45 are materials having a high etching selectivity (about 4 or more) with respect to the source/drain cap insulating layer 80 in the etching of the source/drain cap insulating layer 80. In some embodiments, the etching selectivity is about 6 to 20. Accordingly, the source/drain cap insulating layers 80 can be selectively removed in a self-aligned manner. As shown in FIG. 11, an edge of the opening pattern of the second mask layer 74 may be located on at least one gate cap insulating layer 60.

The order of the removal of the gate cap insulating layer 60 and the removal of the source/drain cap insulating layer 80 is interchangeable.

Figure 12:
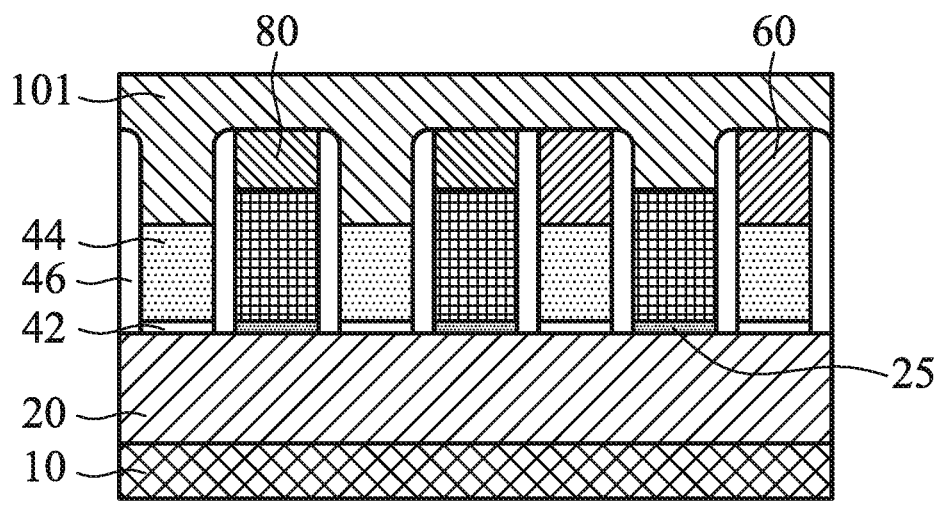

Subsequently, a blanket layer 101 of a second conductive material is formed, as shown in FIG. 12. The second conductive material includes one or more of Cu, W, Co, Ni, Ti or an alloy thereof.

Figure 13:
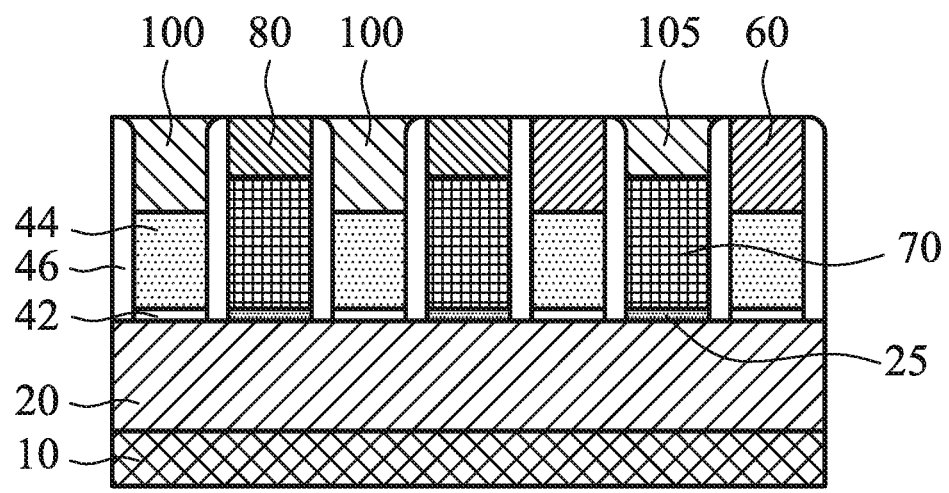

A planarization operation, such as an etch-back process or a CMP process, is performed on the blanket layer 101, so that gate contact layers 100 and source/drain contact layers 105 are formed over the gate electrode 44 and the source/drain conductive layers 70, as shown in FIG. 13.

It is understood that the device shown in FIG. 13 undergoes further CMOS processes to form various features such as interconnect metal layers, dielectric layers, passivation layers, etc.

FIGS. 14-23 show exemplary cross sectional views illustrating various stages of the sequential fabrication process of a semiconductor device according to another embodiment of the present disclosure. It is understood that additional operations can be provided before, during, and after processes shown by FIGS. 14-23, and some of the operations described below can be replaced or eliminated, for additional embodiments of the method. The order of the operations/processes may be interchangeable. The configurations, structures, materials, processes and/or operations substantially the same as those for the foregoing embodiment may be applied to this embodiment, and the detailed explanation thereof may be omitted.

Figure 14:
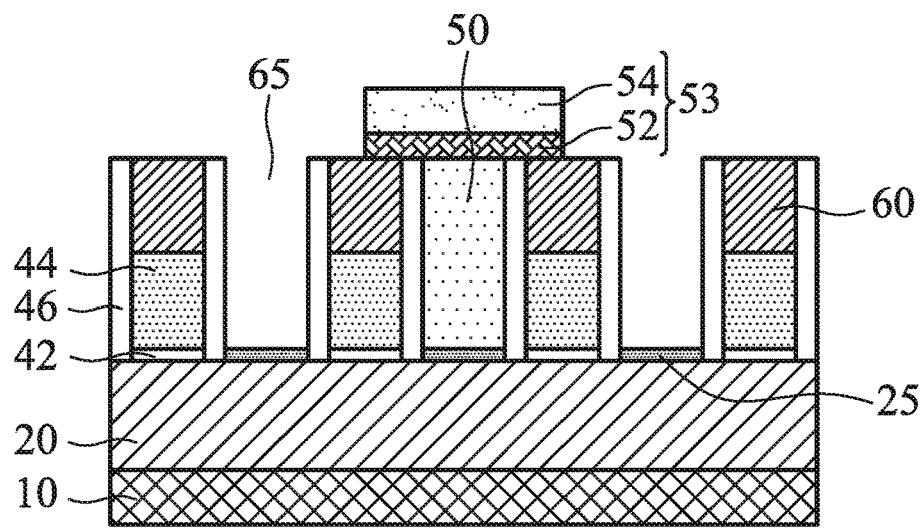
FIGS. 14-23 show exemplary cross sectional views illustrating various stages of the sequential fabrication process of a semiconductor device according to another embodiment of the present disclosure.

After the structure of FIG. 3 is formed, at least one of the source/drain regions with the first ILD 50 is covered by a mask layer 53, as shown in FIG. 14. The mask layer 53 includes a hard mask layer 52 and an organic resin layer 54. The hard mask layer 52 includes one or more layers of TiN, SiN, Ti, Si, TiO$_2$ and SiO$_2$. In one embodiment, the stacked layer of SiO$_2$/Si/SiO$_2$ is used. On the silicon/oxide stack layer of the hard mask layer 52, a photo resist layer or a bottom anti reflection coating layer 54 is formed.

By using the mask layer 53 as an etching mask, the first ILD layers 50 are removed from the source/drain regions not covered by the mask layer 53.

Figure 15:
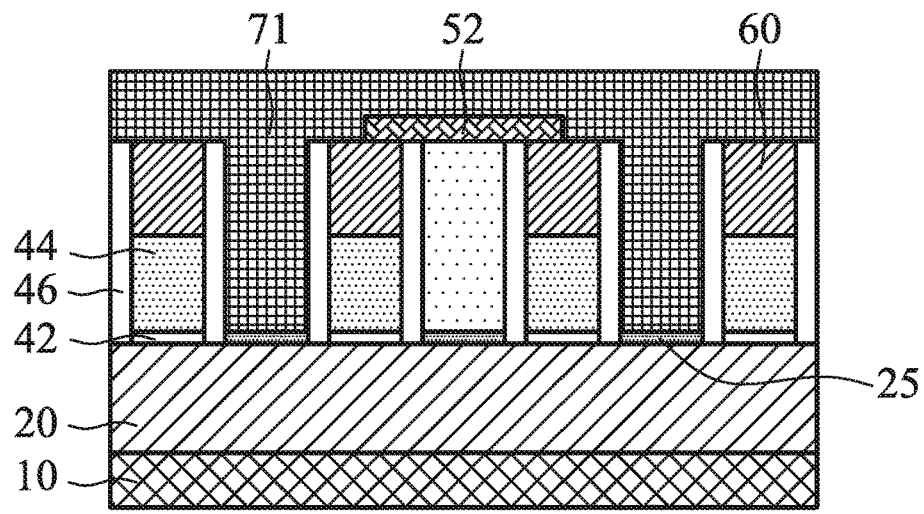
Figure 16:
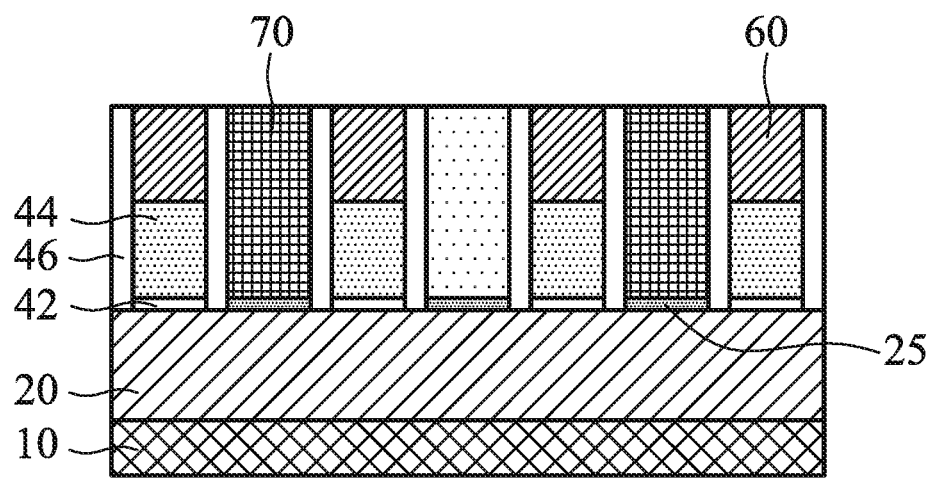

Then, similar to FIG. 5, a blanket layer of a first conductive material 71 is formed, as shown in FIG. 15. Before forming the first conductive material layer, at least the organic resin layer 54 is removed. Subsequently, a planarization operation, such as an etch-back process or a CMP process, is performed on the blanket layer 71, so that the source/drain conductive layers 70 are formed over the source/drain regions 25, as shown in FIG. 16. By the planarization operation, the hard mask layer 52 is removed.

Figure 17:
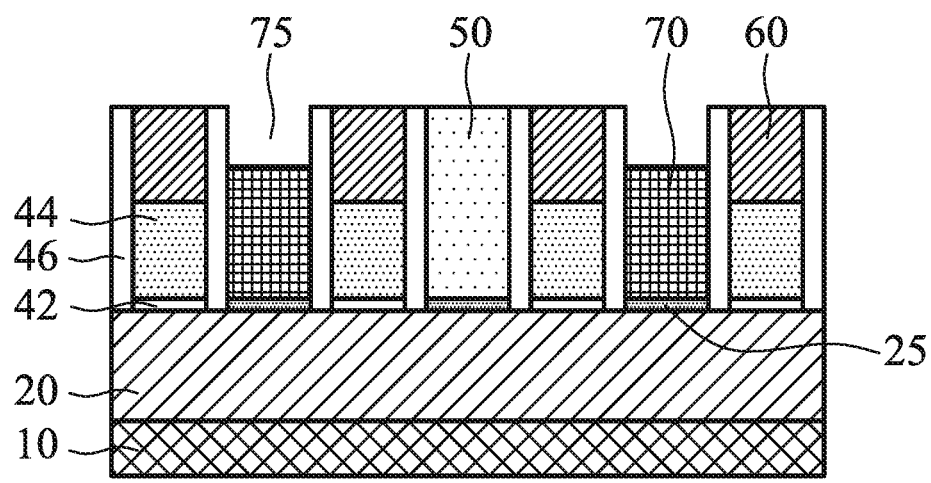

Next, similar to FIG. 7, the source/drain conductive layers 70 are recessed below the upper surface of the sidewall spacers 46 by a dry and/or a wet etching operation, as shown in FIG. 17.

Figure 18:
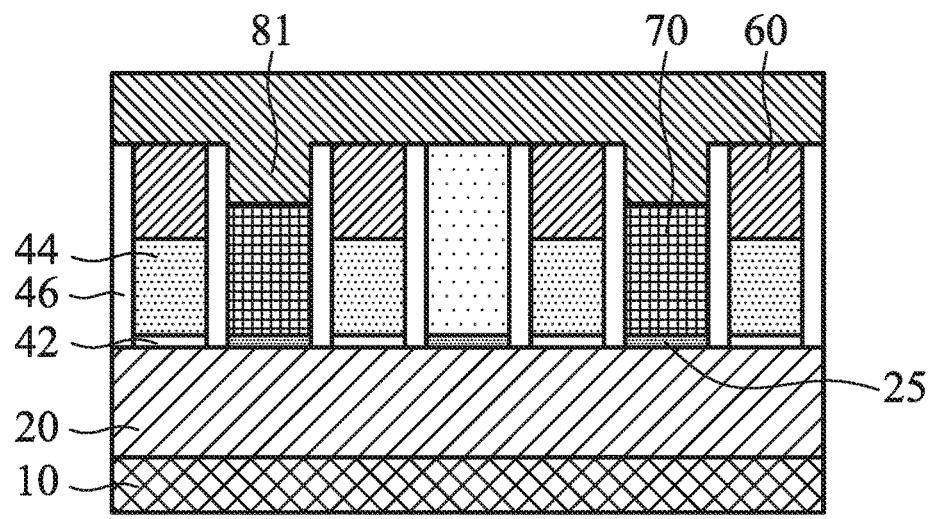
Figure 19:
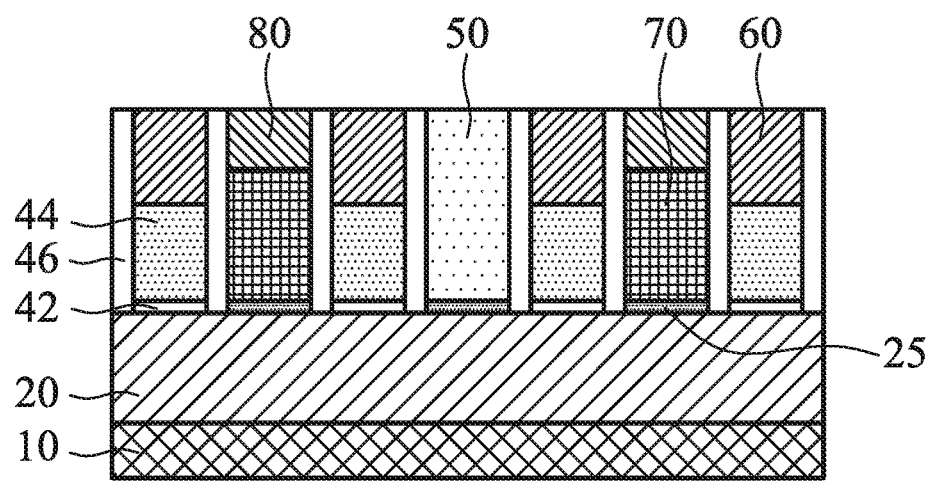

Subsequently, similar to FIG. 8, a blanket layer of a second insulating material 81 is formed, as shown in FIG. 18. Similar to FIG. 9, a planarization operation, such as an etch-back process or a CMP process, is performed on the blanket layer 81, so that the source/drain cap insulating layers 80 are formed over the source/drain conductive layers 70, as shown in FIG. 19.

Figure 20:
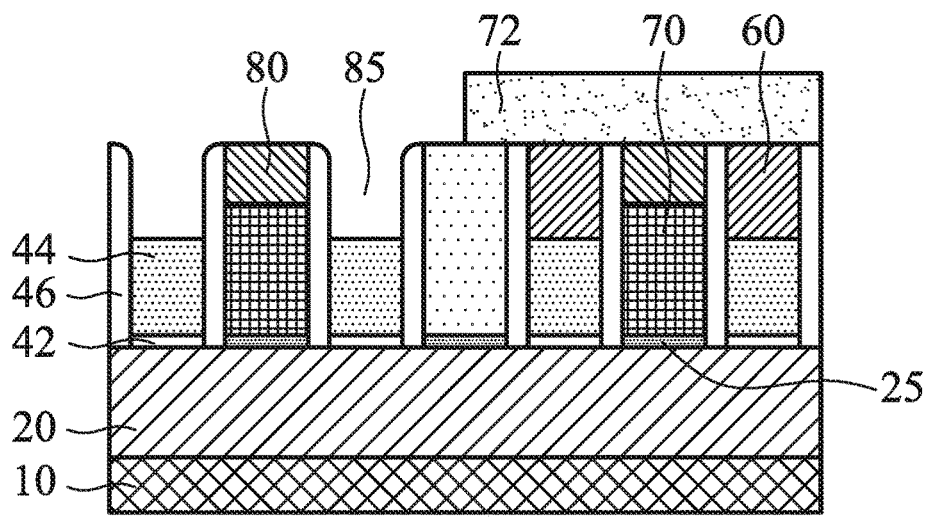

Next, similar to FIG. 10, at least one gate structure (e.g., gate structures 40C and 40D) and at least one source/drain structure with the source/drain cap insulating layer are covered by a first mask layer 72, while at least one gate structure (e.g., 40A and 40B) and at least one source/drain structure with the source/drain cap insulating layer are exposed. Then, the gate cap insulating layers 60 are selectively removed, thereby forming a gate opening 85, as shown in FIG. 20. As shown in FIG. 20, an edge of the opening pattern of the first mask layer 72 may be located on the first ILD layer 50 disposed on at least one source/drain region 25.

Here, the gate cap insulating layer 60, the source/drain cap insulating layer 80, the sidewall spacers 45, and the first ILD layer 50 are made of different insulating materials. In particular, the source/drain cap insulating layer 80, the sidewall spacers 45 and the first ILD layer 50 are materials having a high etching selectivity (about 4 or more) with respect to the gate cap insulating layer 60 in the etching of the gate cap insulating layer 60. In some embodiments, the etching selectivity is about 6 to 20, Accordingly, the gate cap insulating layers 60 can be selectively removed in a self-aligned manner.

Figure 21:
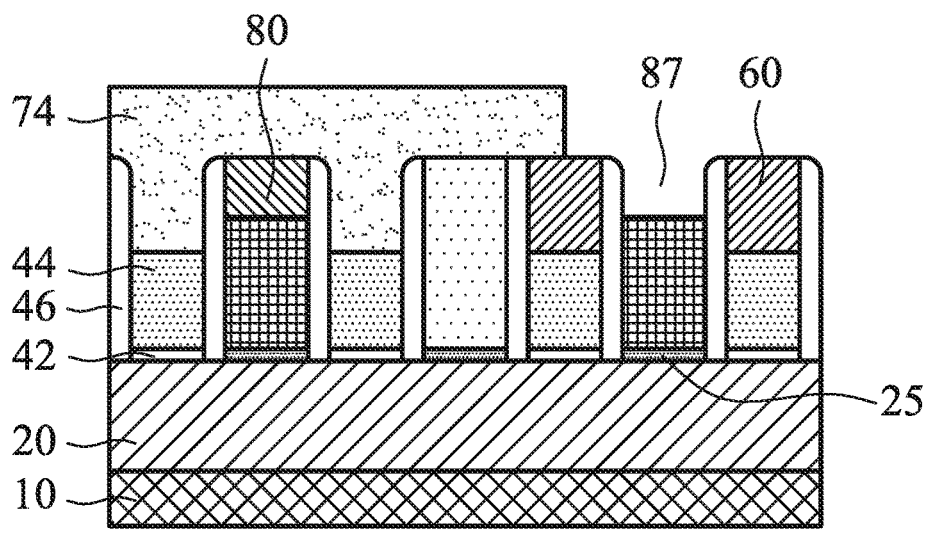

Similar to FIG. 11, at least one gate structure (e.g., gate structures 40A and 40B) and at least one source/drain structure with the source/drain cap insulating layer are covered by a second mask layer 74, while at least one gate structure (e.g., 40D) and at least one source/drain structure with the source/drain cap insulating layer are exposed. Then, the source/drain cap insulating layer 80 are selectively removed, thereby forming a source/drain opening 87, as shown in FIG. 21. As shown in FIG. 21, an edge of the opening pattern of the second mask layer 74 may be located on at least one gate cap insulating layer 60.

The order of the removal of the gate cap insulating layer 60 and the removal of the source/drain cap insulating layer 80 is interchangeable.

Figure 22:
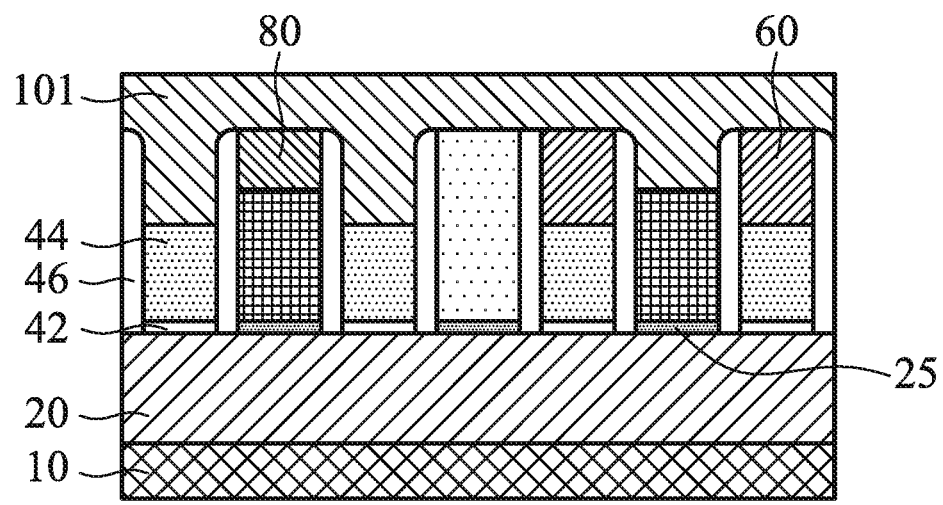

Subsequently, similar to FIG. 12, a blanket layer 101 of a second conductive material is formed, as shown in FIG. 22. A planarization operation, such as an etch-back process or a CMP process, is performed on the blanket layer 101, so that gate contact layers 100 and source/drain contact layers 105 are formed over the gate electrode 44 and the source/drain conductive layers 70, as shown in FIG. 23.

Figure 23:
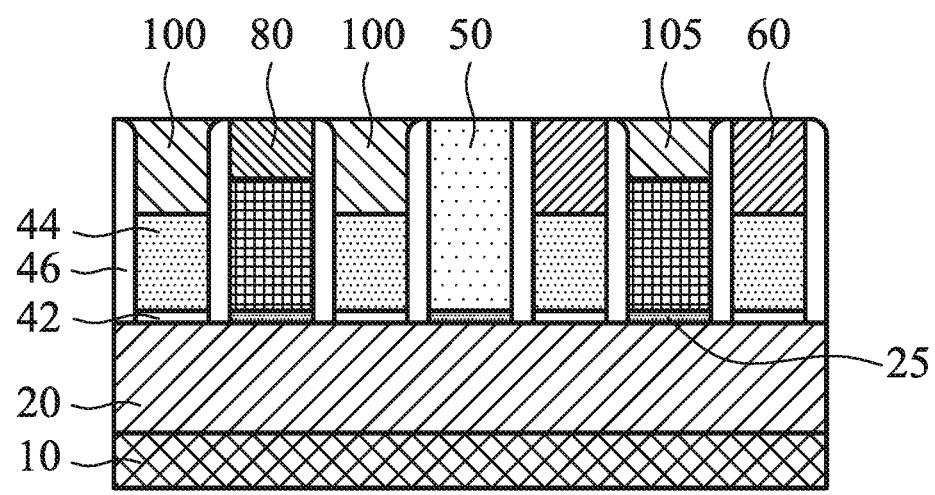

It is understood that the device shown in FIG. 23 undergoes further CMOS processes to form various features such as interconnect metal layers, dielectric layers, passivation layers, etc.

The various embodiments or examples described herein offer several advantages over the existing art.

Figure 24:
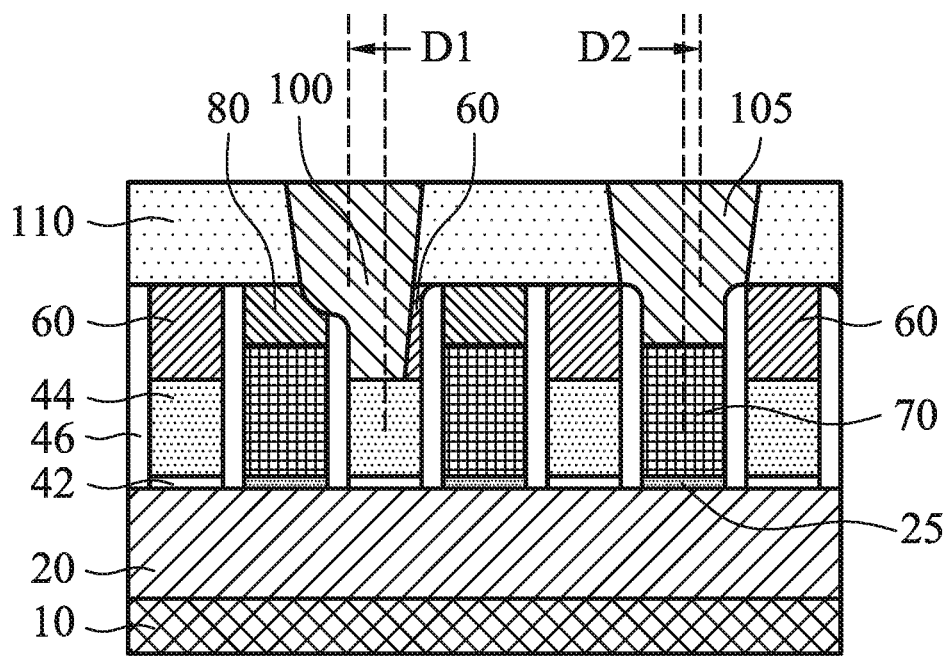
FIG. 24 shows an exemplary cross sectional view illustrating one of advantages of the present embodiments.

FIG. 24 shows an exemplary cross sectional view illustrating one of advantages of the present embodiments.

FIG. 24 illustrate the structure, when a mask pattern having an opening (e.g., a contact hole pattern) above the gate electrode 44 is mis-aligned, for example, to the left by the amount of D1 due to process variation. With the mask pattern, the second ILD layer 110 is etched, and then the gate cap insulating layer 60 is etched. Because of the mis-alignment, a part of the sidewall spacers 46 and/or a part of the source/drain cap insulating layer 80 may be etched. However, the etching electivity of the sidewall spacers 46 and the source/drain cap insulating layer 80 are sufficiently high against the gate cap insulating layer 60, the amount of such an etching can be minimized. Accordingly, the gate contact 100 can be formed in a self-aligned manner avoiding a short-circuit to the source/drain conductive layer 70.

Similarly, as shown in FIG. 24, a mask pattern having an opening (e.g., a contact hole pattern) above the source/drain conductive layer 70 may be mis-aligned, for example, to the right by the amount of D2 due to process variation. With the mask pattern, the second ILD layer 110 is etched, and then the source/drain cap insulating layer 80 is etched. Because of the mis-alignment, a part of the sidewall spacers 46 and/or a part of the gate cap insulating layer 60 may be etched. However, the etching electivity of the sidewall spacers 46 and the gate cap insulating layer 80 are sufficiently high against the source/drain cap insulating layer 80, the amount of such an etching can be minimized. Accordingly, the source/drain contact 105 can be formed in a self-aligned manner avoiding a short-circuit to the gate electrode 44.

Because of the above advantages of the self-align contacts, it is also possible to reduce a gate pattern density.

Figure 25:
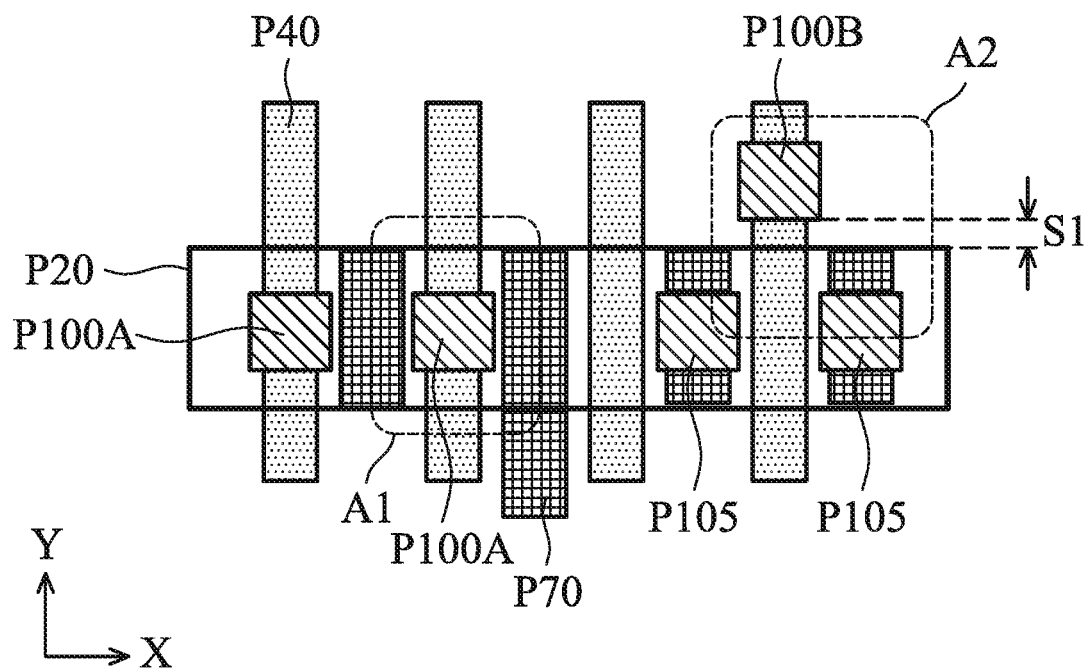
FIG. 25 shows an exemplary layout structure according to one embodiment of the present disclosure.

FIG. 25 shows an exemplary layout structure according to one embodiment of the present disclosure. FIG. 25 shows an exemplary layout structure around a cell boundary of two standard cells.

In FIG. 25, four gate patterns P40 extending in the Y direction are arranged in the X direction with an equal interval. Source/drain patterns P70 are disposed between the adjacent two gate patterns. Gate contact patterns P100A are disposed over the gate patterns above a fin pattern P20. A gate contact pattern P100B is also disposed over the gate patterns above an area other than the fin pattern P20. Source/drain contacts P105 are disposed over the source/drain patterns P70.

In the present embodiments, since the gate contact 100 can be formed in a self-aligned manner substantially free from a short-circuit to the source/drain conductive layer 70, the gate contact pattern P100A (gate contact 100) can be arranged over the fin pattern P20 (fin structure 20) in which the source/drain patterns P70 (source/drain conductive layer 70) are disposed, as shown in area A1 of FIG. 25.

Similarly, in area A2 of FIG. 25, the gate contact pattern P100B can be arranged closer to the fin pattern P20. The space Si between the gate contact pattern P100B and the fin pattern P20 is less than about 15 nm and in a range from about 5 nm to about 12 nm in some embodiments.

Accordingly, it is possible to reduce a gate pattern density.

It will be understood that not all advantages have been necessarily discussed herein, no particular advantage is required for all embodiments or examples, and other embodiments or examples may offer different advantages.

According to one aspect of the present disclosure, in a method of manufacturing a semiconductor device, gate structures extending in a first direction and arranged in a second direction crossing the first direction are formed. Each of the gate structures includes a gate electrode, a gate cap insulating layer disposed over the gate electrode, sidewall spacers disposed on opposing side faces of the gate electrode and the gate cap insulating layer. Source/drain structures are formed between adjacent two gate structures. Each of the source/drain structures includes a source/drain conductive layer and a source/drain cap insulating layer disposed on the source/drain conductive layer. The gate cap insulating layer is selectively removed from at least one of the gate structures, while at least one of remaining gate structures is protected, thereby exposing the gate electrode of the at least one of the gate structures. The source/drain cap insulating layer is selectively removed from at least one of the source/drain structures, while at least one of remaining source/drain structures is protected, thereby exposing the source/drain conductive layer of the at least one of the source/drain structures. Conductive contact layers are formed on the exposed gate electrode and the exposed source/drain conductive layer.

According to another aspect of the present disclosure, in a method of manufacturing a semiconductor device, a first gate structure, a second gate structure, a third gate structure and a fourth gate structure, which extend in a first direction, are formed over a substrate. The first gate structure includes a first gate electrode, a first gate dielectric layer, first sidewall spacers disposed on opposing side faces of the first gate electrode. The second gate structure includes a second gate electrode, a second gate dielectric layer, second sidewall spacers disposed on opposing side faces of the second gate electrode. The third gate structure includes a third gate electrode, a third gate dielectric layer, third sidewall spacers disposed on opposing side faces of the third gate electrode. The fourth gate structure includes a fourth gate electrode, a fourth gate dielectric layer, fourth sidewall spacers disposed on opposing side faces of the fourth gate electrode. The first to the fourth gate structures are arranged in a second direction crossing the first direction. A first source/drain region is formed between the first and second gate structures, a second source/drain region is formed between the second and third gate structures, and a third source/drain region is formed between the third and fourth gate structures. A first insulating layer is formed over the first to third source/drain regions. The first to fourth gate electrodes are recessed below upper surfaces of the first to fourth sidewall spacers, thereby forming a first to a fourth gate opening, respectively. A first to a fourth gate cap insulating layer are formed in the first to the fourth gate openings, respectively. The first insulating layer is removed so as to expose the first and third source/drain regions. A first and a third source/drain conductive layers are formed over the first and third source/drain regions, respectively. The first and the third source/drain conductive layers are recessed below upper surfaces of the first to fourth sidewall spacers, thereby forming a first and a third source/drain opening, respectively. A first and a third source/drain cap insulating layer are formed in the first and the third source/drain openings, respectively. The first and second gate cap insulating layers are removed, while protecting the third and fourth gate cap insulating layers and the third source/drain cap insulating layer, thereby exposing the first and second gate electrodes. The third source; drain cap insulating layer is removed, while protecting the first source/drain cap insulating layer, thereby exposing the third source/drain region. Conductive contact layers are formed on the exposed first and second gate electrodes and the exposed third source/drain region.

In accordance with yet another aspect of the present disclosure, a semiconductor device includes a first gate structure, a second gate structure, a first source/drain structure and a second source/drain structure. The first gate structure includes a first gate electrode and a first cap insulating layer disposed on the first gate electrode. The second gate structure includes a second gate electrode and a first conductive contact layer disposed on the first gate electrode. The first source/dram structure includes a first source/drain conductive layer and a second cap insulating layer disposed over the first source/drain conductive layer. The second source/drain structure includes a second source/drain conductive layer and a second conductive contact layer disposed over the second source/drain conductive layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming gate structures extending in a first direction and arranged in a second direction crossing the first direction, each of the gate structures including a gate electrode, a gate cap insulating layer disposed over the gate electrode, sidewall spacers disposed on opposing side faces of the gate electrode and the gate cap insulating layer;
    forming source/drain structures on source/drain epitaxial layers between adjacent two gate structures, each of the source/drain structures including a source/drain conductive layer and a source/drain cap insulating layer disposed on the source/drain conductive layer;
    forming a first mask layer having a first opening over the gate structures and the source/drain structures, wherein under the first opening, tops of the sidewall spacers disposed on opposing side faces of the gate electrode and the gate cap insulating layer of the at least one of the gate structures are exposed, and at least one edge of the first opening is located on the source/drain cap insulating layer of one of the source/drain structures;
    selectively removing the gate cap insulating layer through the first opening from at least one of the gate structures, while protecting at least one of remaining gate structures, thereby exposing the gate electrode of the at least one of the gate structures, wherein the gate cap insulating layer is fully removed from the at least one of the gate structures under the first opening;
    forming a second mask layer having a second opening over the gate structures and the source/drain structures, wherein under the second opening, a top of one of the sidewall spacers of one of the gate structures and a top of one of the sidewall spacers of adjacent one of the gate structures are exposed, and at least one edge of the second opening is located on the gate cap insulating layer of one of the gate structures;
    selectively removing the source/drain cap insulating layer through the second opening from at least one of the source/drain structures, while protecting at least one of remaining source/drain structures, thereby exposing the source/drain conductive layer of the at least one of the source/drain structures, wherein the source/drain cap insulating layer is fully removed from the at least one of the source/drain structures under the second opening; and
    forming conductive contact layers on the exposed gate electrode and the exposed source/drain conductive layer,
    wherein the forming conductive contact layers includes:
        forming a conductive material over the exposed gate electrode, the exposed source/drain conductive layer, the at least one of remaining gate structures and the at least one of remaining source/drain structures, and performing a chemical mechanical polishing operation such that the gate cap insulating layer of the at least one of remaining gate structures and the source/drain cap insulating layer of the at least one of remaining source/drain structures are exposed.

2. The method of claim 1, wherein in the selectively removing the gate cap insulating layer of the at least one of the gate structures, at least one source/drain cap insulating layer is not protected.

3. The method of claim 1, wherein in the selectively removing the source/drain cap insulating layer of the at least one of the source/drain structures, at least one gate cap insulating layer is not protected.

4. The method of claim 1, wherein an upper surface of the gate electrode of each of the gate structures is located at a different level from an upper surface of the source/drain conductive layer of each of the source/drain structures.

5. The method of claim 4, wherein the upper surface of the gate electrode of each of the gate structures is located at a lower level than the upper surface of the source/drain conductive layer of each of the source/drain structures.

6. The method of claim 1, wherein the gate cap insulating layer of each of the gate structures is made of different material than the source/drain cap insulating layer of each of the source/drain structures.

7. The method of claim 6, wherein the gate cap insulating layer of each of the gate structures and the source/drain cap insulating layer of each of the source/drain structures are made of at least one of SiC, SiOCN, SiON, SiCN and SiN.

8. The method of claim 1, wherein the sidewall spacers of each of the gate structures are made of different material than the gate cap insulating layer of each of the gate structures and the source/drain cap insulating layer of each of the source/drain structures.

9. The method of claim 8, wherein the sidewall spacers of each of the gate structures are made of at least one of SiC, SiON, $Al_2O_3$, SiOCN, SiCN and SiN.

10. The method of claim 1, wherein a thickness of the gate cap insulating layer is greater than a thickness of the source/drain cap insulating layer.

11. A method of manufacturing a semiconductor device, the method comprising:
forming a first gate structure, a second gate structure, a third gate structure and a fourth gate structure, which extend in a first direction, over a substrate, the first gate structure including a first gate electrode, a first gate dielectric layer, first sidewall spacers disposed on opposing side faces of the first gate electrode, the second gate structure including a second gate electrode, a second gate dielectric layer, second sidewall spacers disposed on opposing side faces of the second gate electrode, the third gate structure including a third gate electrode, a third gate dielectric layer, third sidewall spacers disposed on opposing side faces of the third gate electrode, the fourth gate structure including a fourth gate electrode, a fourth gate dielectric layer, fourth sidewall spacers disposed on opposing side faces of the fourth gate electrode, the first to the fourth gate structures being arranged in a second direction crossing the first direction;
forming a first source/drain region between the first and second gate structures, a second source/drain region between the second and third gate structures, and a third source/drain region between the third and fourth gate structures;
forming a first insulating layer over the first to third source/drain regions;
recessing the first to fourth gate electrodes below upper surfaces of the first to fourth sidewall spacers, thereby forming a first to a fourth gate opening, respectively;
forming a first to a fourth gate cap insulating layer in the first to the fourth gate openings, respectively;
removing the first insulating layer so as to expose the first, second and third source/drain regions;
forming a first, a second and a third source/drain conductive layers over the first, second and third source/drain regions, respectively;
recessing the first, the second and the third source/drain conductive layers below upper surfaces of the first to fourth sidewall spacers, thereby forming a first, a second and a third source/drain opening, respectively;
forming a first, a second and a third source/drain cap insulating layer in the first, the second and the third source/drain openings, respectively;
removing the first and second gate cap insulating layers, while protecting the third and fourth gate cap insulating layers and the third source/drain cap insulating layer, thereby exposing the first and second gate electrodes, and exposing the first and second source/drain cap insulating layers;
removing the third source/drain cap insulating layer, while protecting the first source/drain cap insulating layer, thereby exposing the third source/drain conductive layer, and exposing the third and fourth gate cap insulating layers; and
forming conductive contact layers on the exposed first and second gate electrodes and the exposed third source/drain conductive layer,
wherein the forming conductive contact layers includes:
forming a conductive material over the exposed first and second gate electrodes and the exposed third source/drain conductive layer, the third and fourth gate cap insulating layers and the first source/drain cap insulating layer, and
performing a chemical mechanical polishing operation such that the third and fourth gate cap insulating layers and the first source/drain cap insulating layer are exposed.

12. The method of claim 11, wherein:
the first to fourth gate cap insulating layers are made of different material than the first and third source/drain cap insulating layers,
the first to fourth gate cap insulating layers and the first and third source/drain cap insulating layers are made of at least one of SiC, SiON, SiOCN, SiCN and SiN,
the first to fourth sidewall spacers are made of different material than the first to the fourth gate cap insulating layers and the first and third source/drain cap insulating layer, and
the first to fourth sidewall spacers are made of at least one of SiC, SiON, $Al_2O_3$, SiOCN, SiCN and SiN.

13. The method of claim 11, wherein a thickness of the first to fourth gate cap insulating layers is greater than a thickness of the first to third source/drain cap insulating layers.

14. The method of claim 11, wherein:
the first and second gate cap insulating layers are fully removed through a first opening formed in a first mask layer, and
the third source/drain cap insulating layers are fully removed through a second opening formed in a second mask layer.

15. A method of manufacturing a semiconductor device, the method comprising:
forming a gate structure over a substrate, the gate structure including a gate electrode, a gate dielectric layer and first sidewall spacers;

forming a source/drain region;

forming a first insulating layer over the source/drain region;

recessing the gate electrode of the gate structure below upper surfaces of the first sidewall spacers, thereby forming a gate opening over the recessed gate electrode;

forming a gate cap insulating layer in the gate opening;

removing the first insulating layer so as to expose the source/drain region;

forming a source/drain conductive layer over the source/drain region;

recessing the source/drain conductive layer below the upper surfaces of the first sidewall spacers, thereby forming a source/drain opening over the recessed source/drain conductive layer;

forming a source/drain cap insulating layer in the source/drain opening;

forming a first mask layer having a first opening over the gate cap insulating layer, wherein under the first opening, tops of the first sidewall spacers and the gate cap insulating layer of the gate structure are exposed, and at least one edge of the first opening is located on another source/drain cap insulating layer different from the source/drain cap insulating layer;

removing the gate cap insulating layer through the first opening, thereby exposing the recessed gate electrode wherein the gate cap insulating layer is fully removed under the first opening;

forming a second mask layer having a second opening over the source/drain cap insulating layer, wherein under the second opening, a top of one of second sidewall spacers different from the first sidewall spacers and a top of one of third sidewall spacers different from the first sidewall spacers are exposed, and at least one edge of the second opening is located on another gate cap insulating layer different from the gate cap insulating layer;

removing the source/drain cap insulating layer through the second opening, thereby exposing the recessed source/drain conductive layer wherein the source/drain cap insulating layer is fully removed under the second opening; and forming conductive contact layers on the exposed recessed gate electrodes and the exposed recessed source/drain conductive layer by a same operation, wherein:

the removing the gate cap insulating layer and the removing the source/drain cap insulating layer are performed by different etching operations, and the forming conductive contact layers includes:
  forming a conductive material over exposed recessed gate electrodes and the exposed recessed source/drain conductive layer, and the first sidewall spacers, and
  performing a chemical mechanical polishing operation such that the first sidewall spacers are exposed.

16. The method of claim 15, wherein the removing the gate cap insulating layer is performed before the removing the source/drain cap insulating layer.

17. The method of claim 16, wherein the gate cap insulating layer is removed while protecting the source/drain cap insulating layer.

18. The method of claim 15, wherein a thickness of the gate cap insulating layer is greater than a thickness of the source/drain cap insulating layer.

* * * * *